United States Patent [19]

Martorana et al.

[11] Patent Number: 5,077,637

[45] Date of Patent: Dec. 31, 1991

[54] SOLID STATE DIRECTIONAL THERMAL CABLE

[75] Inventors: Richard T. Martorana, Andover; Thomas D. Heimann, Methuen; John Bimshas, Winchester, all of Mass.

[73] Assignee: The Charles Stark Draper Lab., Inc., Cambridge, Mass.

[21] Appl. No.: 412,155

[22] Filed: Sep. 25, 1989

[51] Int. Cl.⁵ ............................................... H05K 7/20
[52] U.S. Cl. ..................................... 361/386; 165/185; 174/16.3; 174/252; 357/81; 361/415; 427/96; 428/408; 428/901
[58] Field of Search ............................. 357/81, 82, 80; 165/80.2, 80.3, 185, 905; 174/16.3, 252, 36, 256, 74 R; 428/406, 408, 457, 461, 901, 902; 427/96; 361/383, 385, 386-388, 400, 403, 414, 415; 350/96.24

[56] References Cited

U.S. PATENT DOCUMENTS

| | | | |
|---|---|---|---|
| 4,688,891 | 8/1987 | Carratt | 350/96.24 |
| 4,689,110 | 8/1987 | Leibowitz | 361/388 |
| 4,814,945 | 3/1989 | Leibowitz | 361/414 |
| 4,830,458 | 5/1989 | Hiltebrandt | 350/96.24 |
| 4,867,235 | 9/1989 | Grapes | 165/185 |
| 4,922,381 | 5/1990 | Longerich | 361/414 |
| 4,937,140 | 6/1990 | McCullough, Jr. | 428/375 |
| 4,964,692 | 10/1990 | Prescott | 350/96.24 |
| 4,971,570 | 11/1990 | Tolle | 361/388 |
| 4,983,425 | 1/1991 | Zahn | 343/853 |

OTHER PUBLICATIONS

Research Disclosure 4/88, #288, "Electrical . . . Chips", England, p. 1.

Primary Examiner—Gerald P. Tolin
Attorney, Agent, or Firm—Iandiorio & Dingman

[57] ABSTRACT

A solid state, directional, thermal cable including a bundle of elongated, flexible, carbon fibers having a high thermal conductivity in at least the longitudinal direction. Couplings at each end of the cable, bind together the fiber bundle and thermally engage the cable with objects having different temperatures, for transferring heat between the objects. The thermal cable may be used with a frame which supports a device to or from which heat is to be transferred. The thermal cable engages with the frame at a first region proximate the device, and with a second region remote from the device for transferring heat between the first and second regions. The heat transfer frame may include a composite material whose constituents have at least two different coefficients of thermal expansion, for establishing the overall coefficient of thermal expansion of the composite material. One of the constituents may have a negative coefficient of thermal expansion, and may be a carbon based material.

23 Claims, 4 Drawing Sheets

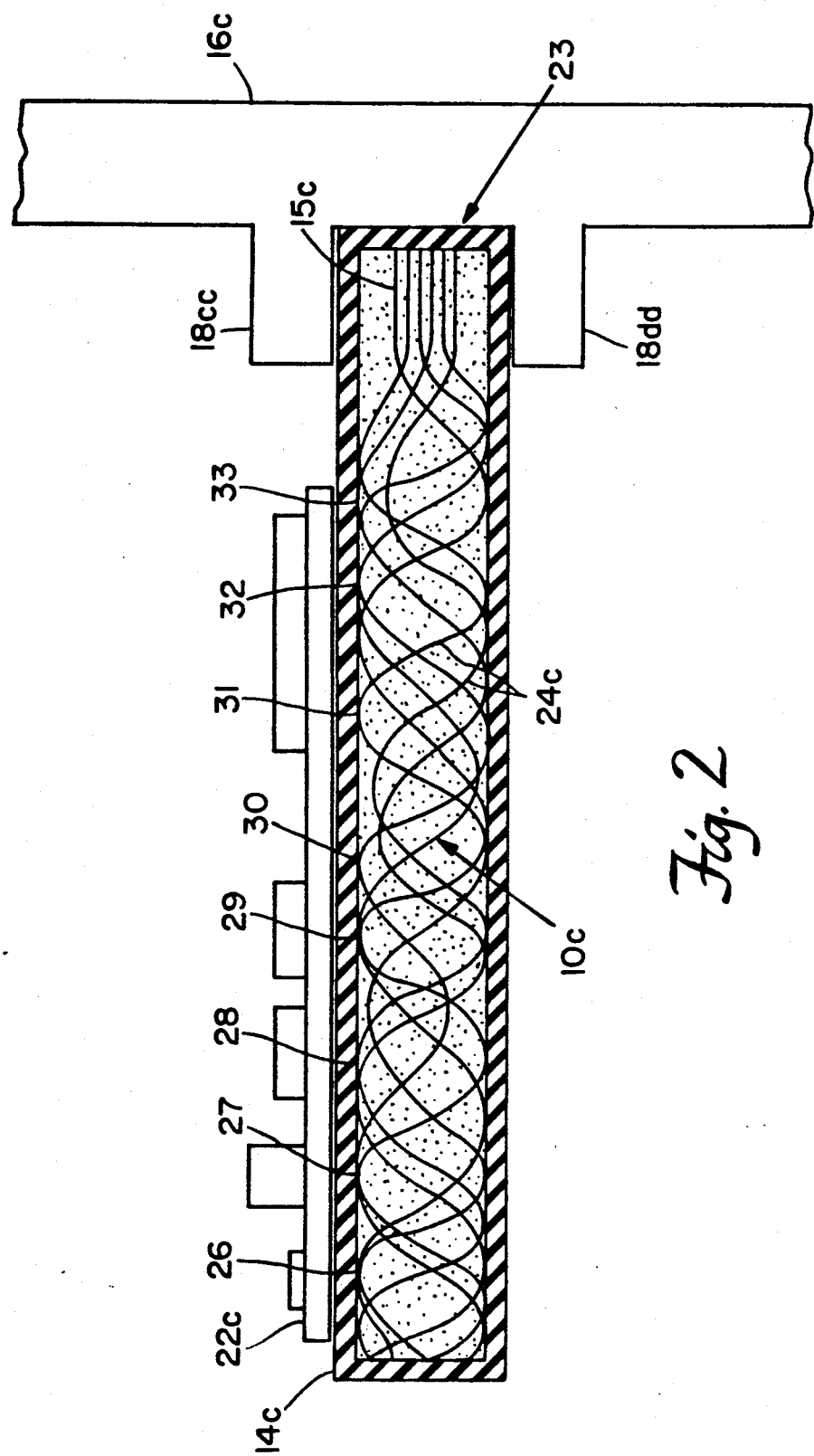

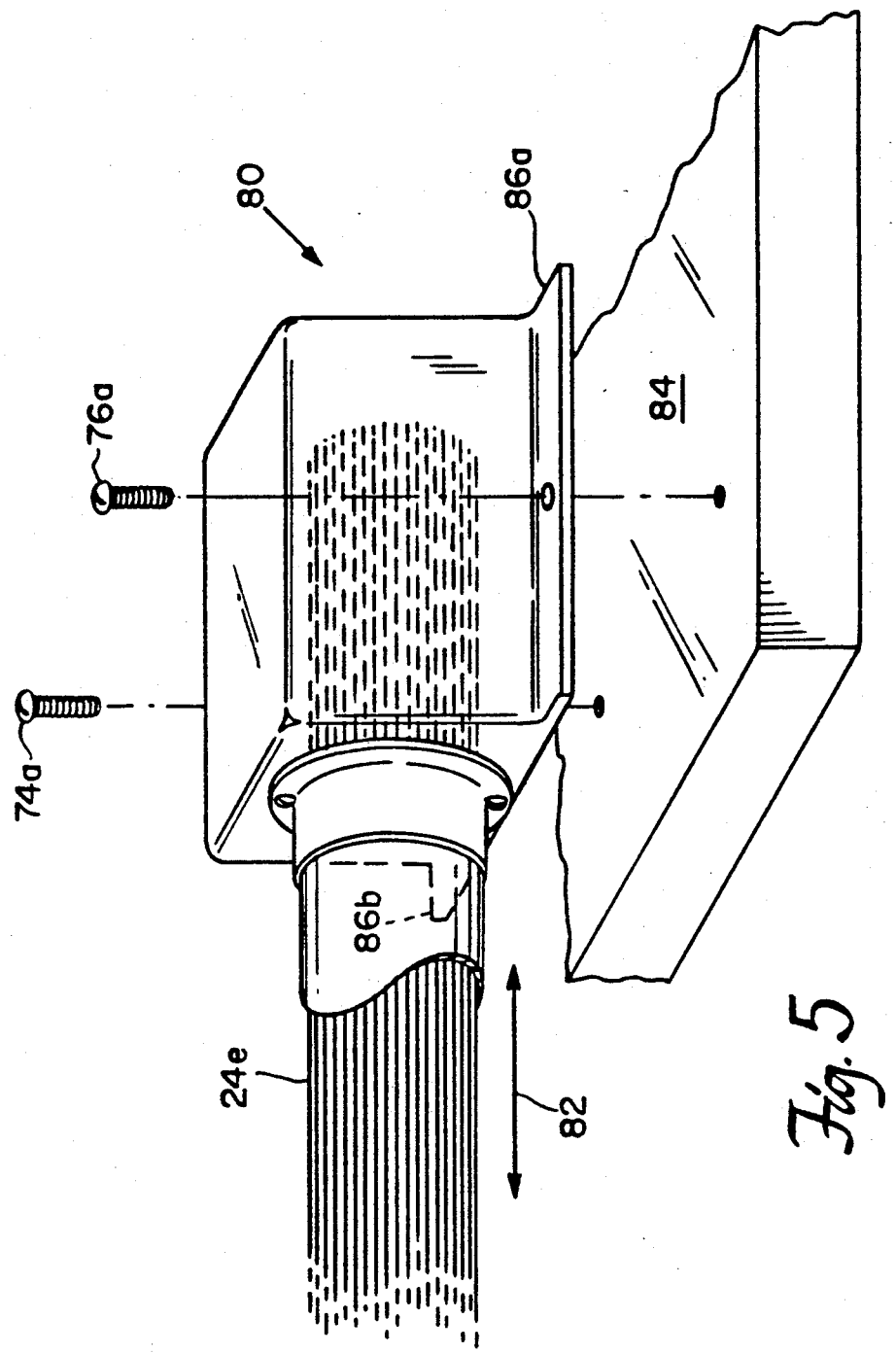

SOLID STATE DIRECTIONAL THERMAL CABLE

FIELD OF INVENTION

This invention relates to a thermally conductive cable, and more particularly, to a flexible, solid-state, thermally conductive cable used to transfer heat between objects at different temperatures without the transfer of stress.

BACKGROUND OF INVENTION

There are many applications where heat must be transferred between objects having different temperatures. The electronics industry, for example, must transfer heat from an electronic module or other high-heat generating device to a heat sink or similar heat-dissipating device.

Several methods of transferring heat between devices have been attempted, but all have significant limitations. One such attempt involves attaching a heat sink directly to the heat-generating device. In such a system, the concern is to maximize the conductivity of the heat sink in proportion to its weight. Generally, if the heat sink material is made lightweight, its heat conductivity is too low. If a better heat conductor such as copper is used, weight becomes a problem. Most importantly, attaching the heat sink directly to the heat source allows one device to transfer loads or stress to the other device. Such stress may be caused by physical movement of one device as a result of shock or vibration; or thermal stress which induces strains. This thermal stress is caused by the difference in the coefficients of thermal expansion of the heat source and the heat sink. Further attempts have been made at reducing the stress transferred between two devices by providing flexible heat conductors. For example, straps or woven strands of a conductive material such as copper may be utilized. Although these flexible heat conductors have conductivity-to-weight ratios much higher than that of the corresponding solid material, they are still not efficient heat conductors and have some rigidity to transfer stress.

Pumping systems have also been used in an attempt to transfer heat between two or more objects. Pumping a fluid medium within such a system, however, requires a source of power to drive the pump. In addition, such systems often exchange a product of the heat transfer into the environment. Operation life is limited by the amount of fuel to be stored. Such pumps also pose problems of torque on space structures.

Another device for heat transfer involves a wicking device, more commonly referred to as a heat pipe. Although these devices are passive, they do require a capillary pumping action. The devices are complex, difficult to fabricate, and sensitive to gravity. In addition, there is an upper limit on the amount of heat transfer that can take place between such a heat pipe and another device. Finally, there is the consideration that such heat pipes can suffer low-grade, long-term chemical degradation, imposing a limit on the useful life of such systems.

SUMMARY OF INVENTION

It is therefore an object of this invention to provide a solid state, directional, thermal conductor which is lightweight and provides a high absolute thermal conductivity, thereby maintaining a high conductivity-to-weight ratio.

It is a further object of this invention to provide such a thermal conductor in the form of a thermal cable which is completely passive and has no limit on its useful life.

It is a still further object of this invention to provide such a thermal cable which optimizes high flexibility and thermal transfer directionality.

It is a further object of this invention to provide such a thermal cable which provides an extremely low mechanical load transfer to an adjacent device.

It is a further object of this invention to provide such a thermal cable which is simple and inexpensive to manufacture.

It is a further object of this invention to provide such a thermal cable which is reversible or bidirectional and can be bifurcated into two or more cables for multiple heat sources or sinks.

It is a still further object of this invention to provide such a thermal cable which does not require an exchange with the surrounding environment.

It is a further object of this invention to provide such a thermal cable which can be used with a heat transfer frame having a coefficient of thermal expansion tuned to match that of an adjacent device with which heat is to be transferred.

This invention results from the realization that a truly novel and useful solid state, directional, thermal conductor can be achieved by providing a lightweight bundle of flexible, highly directional, thermally conductive fibers in the form of a thermal cable, which is effective in transferring heat from one object to another without the transfer of stress.

This invention results from the further realization that such a thermal cable may be coupled with a frame having a coefficient of thermal expansion tuned to that of an adjacent device from which heat is to be transferred, thereby separately optimizing the matching of coefficients of thermal expansion and high thermal conductivity.

This invention features a solid state, directional, thermal cable including a plurality of elongated, flexible, carbon fibers having a high thermal conductivity in at least the longitudinal direction. There are coupling means at each end of the cable for binding together the fiber bundle and thermally engaging the fiber bundle with objects having different temperatures for transferring heat between the objects.

In a preferred embodiment, the carbon fibers are graphite and the coupling means include means for securing the coupling to each of the objects between which heat is to be transferred. The carbon fibers may be anisotropic and the carbon may be graphite, diamond, carbon fibers or other carbon based material. The thermal cable may include more than two ends and may be enclosed within a protective sheath.

This invention also features a heat transfer frame for use with a solid state, thermal cable. The frame is mounted proximate a device to or from which heat is to be transferred. The frame includes a region adjacent to which are disposed a plurality of elongated, flexible, carbon fibers having a high thermal conductivity in at least a longitudinal direction. The carbon fibers are engaged with the frame at a first region proximate the device, and at a second region remote from the device for transferring heat between the first and second regions.

In a preferred embodiment, the heat transfer frame includes a composite material whose constituents have at least two different coefficients of thermal expansion, for establishing the overall coefficient of thermal expansion for the composite material. One of the constituents may have a negative coefficient of thermal expansion and may include a carbon based material such as graphite or diamond.

DISCLOSURE OF PREFERRED EMBODIMENT

Other objects, features and advantages will occur to those skilled in the art from the following description of a preferred embodiment and the accompanying drawings, in which:

FIG. 2 is an alternative arrangement of the bundle of heat transfer fibers of the solid state, directional, thermal cable and frame of FIG. 1;

FIG. 5 is a cross section of a solid state, directional, thermal cable and coupling wherein heat is coupled to the cable in a direction normal to the fibers.

A solid state, directional, thermal cable according to this invention may be accomplished using a bundle of elongated, flexible, heat transfer fibers which have a high thermal conductivity at least in the longitudinal direction. An example of such fibers are continuous strand graphite fibers available as P-100 material from Amoco Performance Products. This material exhibits anisotropic behavior with regard to thermal conductivity; that is, the thermal conductivity of the material in the longitudinal direction of the fibers is several orders of magnitude greater than the thermal conductivity perpendicular to the fibers.

Coupling means are provided at each end of the cable for binding together the fiber bundle and thermally engaging the fiber bundle with objects having different temperatures, to transfer heat between the objects. Typically, the coupling includes means for securing the coupling to each of the objects. The coupling means may be made from a composite of materials, such as metal and carbon. The coefficients of thermal expansion of the separate materials combine to form the overall coefficient of thermal expansion of the coupling. In this manner, the coefficient of thermal expansion of the coupling may be tailored to match that of an adjacent object with which heat is to be transferred.

The thermal cable may also be used with a heat transfer frame which supports a device with which heat is to be transferred. One end of the cable is engaged with the frame at a first region proximate the device. The other end of the cable is engaged with a second region remote from the device, for transferring heat between the frame region proximate the device and the second region. The second region of the frame may engage with a heat dispersive member. The frame may include a composite material whose constituents have at least two different coefficients of thermal expansion. The coefficients of thermal expansion of at least two constituents combine to establish the overall coefficient of thermal expansion of the composite material that comprises the frame. This enables the thermal coefficient of expansion of the frame to be tailored, or tuned, to match that of the device mounted proximate the frame. Typically, one of the constituents of the composite material has a very low or a negative coefficient of thermal expansion. Such a constituent may include a carbon based material such as carbon, graphite, or diamond in the form of fibers, powder or dust.

Figure 1:
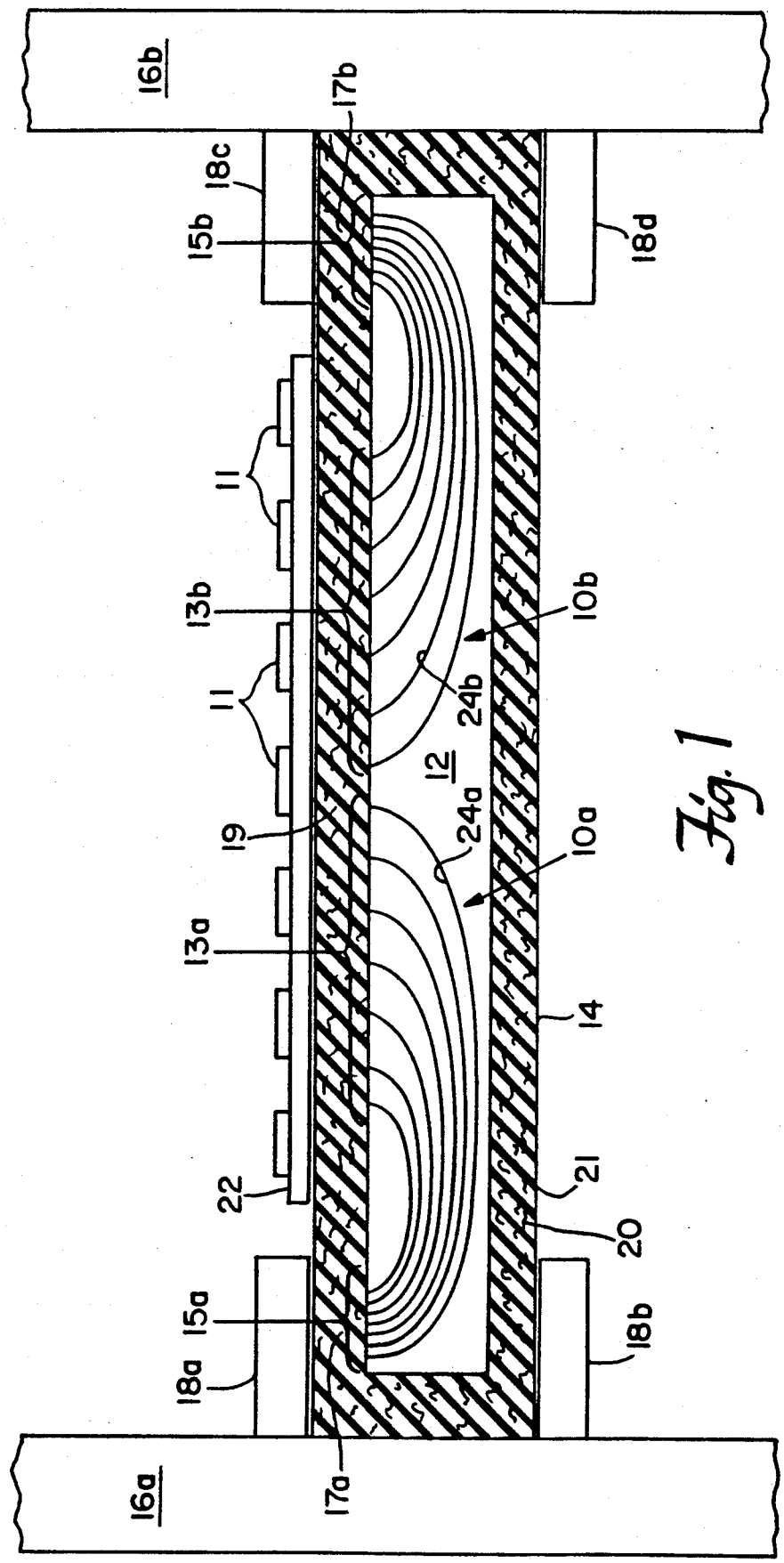
FIG. 1 is a cross section of two solid state, directional, thermal cables according to this invention mounted to a frame having a coefficient of thermal expansion tuned to match the coefficient of thermal expansion of the adjacent printed circuit board for transferring heat from the printed circuit board to a heat dispersive member.

Solid state, directional, thermal cables 10a and 10b, FIG. 1, are shown mounted in chamber 12 of heat transfer frame 14. Thermal cables 10a and 10b include a plurality of graphite fibers 24a, 24b, which engage at one end 13a, 13b, with the heat transfer frame 14 in region 19 proximate a device such as a printed circuit board 22 with which heat is to be transferred. Printed circuit board 22 may include heat generating electronic devices 11. The other end 15a, 15b, of graphite fibers 24a, 24b of cables 10a and 10b are engaged with second region 17a, 17b of heat transfer frame 14, proximate holding tabs 18a, 18b, of heat dispersive members 16a, 16b. Thermal cables 10a and 10b serve to transfer heat between printed circuit board 22, heat transfer frame 14, and heat dispersive members 16a, 16b. Attachment of thermal conductor ends 13a, 13b, 15a, 15b, may be accomplished by gluing the fibers to the frame or embedding the fiber ends into the frame. Gluing may be accomplished utilizing a thermally conductive type glue.

Heat transfer frame 14 is comprised of a composite material including a first material 21 such as aluminum, copper or other materials with which has been mixed with a second material 20 such as carbon fibers. The ratio of carbon fibers to aluminum may be tailored to match the coefficient of thermal expansion of composite heat transfer frame 14 to the coefficient of thermal expansion of printed circuit board 22 mounted proximate the frame.

Graphite fibers 24a, 24b are anisotropic and therefore, placing ends 13a, 13b, and 15a, 15b, of the fibers against or into the surface to or from which heat is to be transferred, results in optimum heat transfer by the fibers. However, if a large enough surface area of the graphite fibers makes contact with an object, a substantial amount of heat is conducted by the fibers.

To properly match the coefficients of thermal expansion of the frame with mounted devices, only low percentages of fiber can be imbedded in the frame or else the frame expansion coefficient may go to zero or become negative. By only loosely attaching the fibers to the frame and leaving most of the fiber free to flex with changes in temperature, many more fibers can be used and therefore greater thermal conductivity is achieved.

In another construction, graphite fibers 24c, FIG. 2, of thermal cable 10c, have an undulating shape and make contact with heat transfer frame 14c proximate printed circuit board 22c at a plurality of locations such as 26-33. Graphite fibers 24c have the smooth surface area of ends 15c engaged with, and perpendicular to, heat transfer frame 14c at region 23, for maximum heat transfer between frame 14c and heat dissipative member 16c. Holding tabs 18cc and 18dd securely engage region 23 of heat transfer frame 14c with heat dissipative member 16c.

Spaces between the fibers 24c may be filled with a loose or soft (low stiffness) material with good thermal conductivity such as metal powders (aluminum, silver), diamond or silicon, carbide powders, liquids or flexible conductive elastomers. This enhances thermal conductivity to and from the fibers without mechanically connecting fibers to frame 14c and affecting the frame's coefficient of thermal expansion.

Figure 3A:
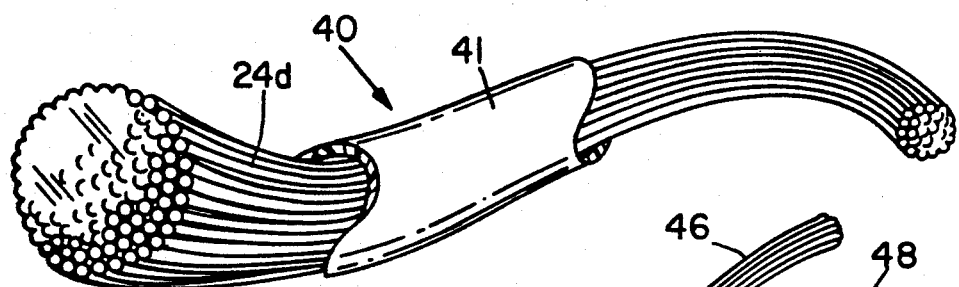
FIG. 3A is an axonometric view with portions removed of a separate solid state directional thermal cable according to this invention.
Figure 3B:
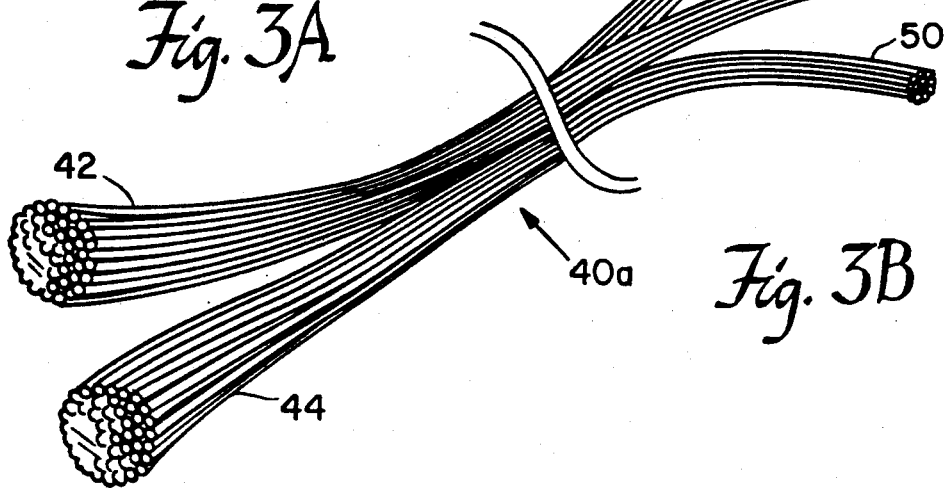
FIG. 3B is an axonometric view of a bifurcated, solid state, directional, thermal cable according to this invention.

Although previously shown in use with heat transfer frame 14, FIG. 1, the solid state, directional, thermal cable 40, FIG. 3A may be used on its own, without a heat transfer frame. In such an embodiment, graphite fibers 24d may be enclosed by a flexible sleeve or sheathing 41 such as a plastic tube. An important feature of the thermal cable according to this invention, is the ability to bifurcate the thermal cable such as cable 40a, FIG. 3B, into cable elements 42-50. In such an embodiment, heat may be efficiently and effectively transferred to or from three or more locations.

Figure 4:
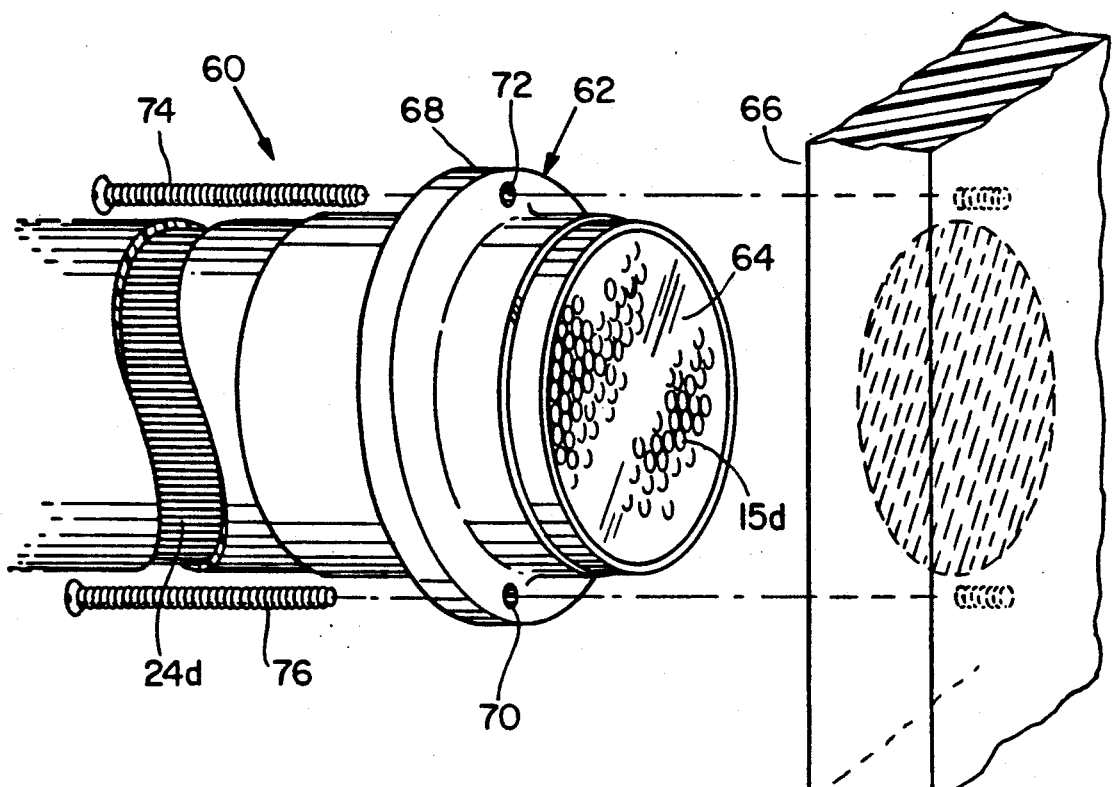
FIG. 4 is an axonometric view of a solid state, directional, thermal cable with a coupling on one end showing a flat, smooth surface for mounting to a device to or from which heat is to be transferred.

In order to engage a thermal cable to a device with which heat is to be transferred, thermal cable end 60, FIG. 4, may be provided with coupling 62 which securely binds together and protects ends 15d of thermally conductive fibers 24d. Coupling 62 allows thermally conductive fibers 24d to be arranged such that their ends 15d form a smooth flat surface 64. Smooth flat surface 64 and therefore each fiber end 15d, contacts device 66 with which heat is to be transferred. Securing ring 68 provides holes 70 and 72 which receive fasteners 74 and 76 for securely fastening flat surface 64 and coupling 62 to device 66. Coupling 62 may be made from conventional materials or from a composite of materials which have a tuned coefficient of thermal expansion. Fibers 24d are inserted into the coupling, and the coupling is secured around the fibers by means such as crimping, potting the fibers in an adhesive or infiltrating the fiber ends with molten metal. Fiber ends 15d are then cut and polished smooth.

Alternatively, coupling 80, FIG. 5, may bundle thermally conductive fibers 24e perpendicular to their longitudinal axis shown by arrow 82. Although the fibers are anisotropic, substantial heat is transferred between the fibers and adjacent device 84 if sufficient surface area of fibers 24e make contact with adjacent device 84 with which heat is to be exchanged. Coupling 80 may also include securing brackets 86a and 86b through which fasteners 74a and 76a may pass, to securely fasten the coupling to the adjacent heat transfer device.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A solid state, directional, flexible thermal cable thermally connected to heat producing objects comprising:
   a bundle of elongated, flexible, carbon fibers each extending the length of said cable and having a high thermal conductivity in at least a longitudinal direction to form a cable; and
   coupling means at each end of said cable both binding together each of said ends and thermally engaging said fiber bundle with said objects, for transferring heat between said objects.

2. The thermal cable of claim 1 in which said carbon fibers are graphite.

3. The thermal cable of claim 1 in which said carbon fibers are diamond.

4. The thermal cable of claim 1 in which said carbon fibers are thermally anisotropic.

5. The thermal cable of claim 1 further including means fastening said coupling means to each of said objects between which heat is to be transferred.

6. The thermal cable of claim 1 in which said cable includes more than two ends.

7. The thermal cable of claim 1 in which said cable includes a flexible protective sheath.

8. The thermal cable of claim 1 in which said coupling means thermally engages each end portion of said fiber bundle with each of said objects.

9. The thermal cable of claim 2 in which said coupling means thermally engages each end of said fiber bundle with each of said objects.

10. A heat transfer frame with solid state flexible thermal cable thermally connected to a device comprising:
    said device to or from which heat is to be transferred;
    a heat transfer frame thermally engaged with said device, said frame including a first region proximate said device, a second region remote from said device, and a chamber within said frame;
    a plurality of elongated, flexible, carbon fibers located within the chamber of said frame and including first and second portions; and
    said first portions engaged with said first region of said frame proximate said device, and said second portions engaged with said second region of said frame remote from said device, for transferring heat between said first and second regions.

11. The heat transfer frame of claim 10 in which interstices between said fibers and chamber are filled with a material having low stiffness and good thermal conductivity to enhance the thermal conductivity to and from said fibers without affecting the coefficient of thermal expansion of the frame.

12. The heat transfer frame of claim 10 in which said first and second portions of said carbon fibers include a first and a second end portion.

13. The heat transfer frame of claim 10 in which said first portions of said carbon fibers each include a central portion and said second portions each include an end portion.

14. The heat transfer frame of claim 10 in which said carbon fibers include graphite fibers.

15. The heat transfer frame of claim 10 in which said frame includes a second and third region, remote from said device.

16. The heat transfer frame of claim 10 in which said frame includes a composite material whose constituents have at least two different coefficients of thermal expansion for establishing the overall coefficient of thermal expansion for the composite material.

17. The heat transfer frame of claim 16 in which one of said constituents has a negative coefficient of thermal expansion.

18. The heat transfer frame of claim 17 in which said constituent with a negative coefficient of thermal expansion, is a carbon based material.

19. The heat transfer frame of claim 18 in which said carbon based material is graphite.

20. The heat transfer frame of claim 18 in which said carbon based material is diamond.

21. The heat transfer frame of claim 15 in which said second and third regions are thermally connected to a heat dispersive member.

22. A composite heat transfer frame with solid state flexible thermal cable thermally connected to a device comprising:
- said device to or from which heat is to be transferred;
- a composite heat transfer frame thermally engaged with said device, said composite frame including a first region proximate said device, a second region remote from said device, and a chamber within said composite frame;
- said composite frame including a first constituent having a positive coefficient of thermal expansion and a second constituent having a negative coefficient of thermal expansion, said first and second coefficients of thermal expansion combining to establish the overall coefficient of thermal expansion of said composite frame;
- a plurality of elongated, flexible, carbon fibers located within the chamber of said composite frame and including said first and second portions; and
- said first portions engaged with said first region of said frame proximate said device, and said second portions engaged with said second region of said frame remote from said device, for transferring heat between said first and second regions.

23. The composite heat transfer frame of claim 22 in which said second constituent is a carbon based material.

* * * * *